(12) United States Patent
Zavadsky et al.

(10) Patent No.: US 8,347,262 B2
(45) Date of Patent: Jan. 1, 2013

(54) METHOD OF DERIVING AN INTEGRATED CIRCUIT SCHEMATIC DIAGRAM

(75) Inventors: Vyacheslav Zavadsky, Ottawa (CA); Edward Keyes, Ottawa (CA); Shane Edmonds, Kanata (CA); Alexei Novikov, Kanata (CA)

(73) Assignee: Semiconductor Insights Inc. (CA)

( * ) Notice: Subject to any disclaimer, the term of this patent is extended or adjusted under 35 U.S.C. 154(b) by 128 days.

(21) Appl. No.: 12/989,739

(22) PCT Filed: Apr. 18, 2008

(86) PCT No.: PCT/CA2008/000734
§ 371 (c)(1),
(2), (4) Date: Oct. 26, 2010

(87) PCT Pub. No.: WO2009/127035
PCT Pub. Date: Oct. 22, 2009

(65) Prior Publication Data
US 2011/0041110 A1 Feb. 17, 2011

(51) Int. Cl.
*G06F 17/50* (2006.01)
(52) U.S. Cl. .......... 716/139; 716/100; 716/102
(58) Field of Classification Search .......... 716/100, 716/102, 103, 106, 110, 111, 139
See application file for complete search history.

(56) References Cited

U.S. PATENT DOCUMENTS

| | | | | |
|---|---|---|---|---|
| 5,287,511 | A * | 2/1994 | Robinson et al. | 717/106 |
| 5,448,493 | A * | 9/1995 | Topolewski et al. | 716/117 |
| 5,524,244 | A * | 6/1996 | Robinson et al. | 717/140 |
| 5,555,270 | A * | 9/1996 | Sun et al. | 714/738 |
| 5,598,344 | A * | 1/1997 | Dangelo et al. | 716/102 |
| 6,216,252 | B1 * | 4/2001 | Dangelo et al. | 716/102 |
| 6,438,734 | B1 * | 8/2002 | Lu | 716/106 |
| 6,536,018 | B1 | 3/2003 | Chisholm et al. | |
| 7,073,141 | B2 | 7/2006 | Novakovsky | |
| 2008/0250213 | A1 * | 10/2008 | Holt | 711/159 |

* cited by examiner

*Primary Examiner* — Sun Lin
(74) *Attorney, Agent, or Firm* — Price Heneveld LLP

(57) ABSTRACT

A method, computer-readable medium and system are described for deriving a schematic diagram representative of an integrated circuit (1C) comprising a plurality of circuit elements. In general, the method, computer-readable medium and system are configured to receive as input a working schematic diagram identifying at least some of the circuit elements, and at least one existing schematic diagram from one or more libraries thereof. Based on this input, at least a portion of the working schematic diagram that matches at least a portion of the at least one existing schematic diagram is identified and replaced, thereby forming a revised schematic diagram.

13 Claims, 13 Drawing Sheets

METHOD OF DERIVING AN INTEGRATED CIRCUIT SCHEMATIC DIAGRAM

FIELD OF TILE INVENTION

The invention is generally related to the use of structural data mining and more particularly to its use in techniques for generating one or more schematic diagrams in the reverse engineering of an integrated circuit.

BACKGROUND

The reverse engineering (RE) of an integrated circuit (IC) generally involves considering the physical structure of the circuit after fabrication and developing a schematic diagram thereof. Therefore, the reverse engineering of an integrated circuit may consist of a multi-step process wherein a schematic diagram of the IC is generated from the finished product. Until recently, RE of ICs has been implemented via manual techniques including the collection of images of circuit elements, the identification of circuit elements and the tracing of signals therebetween. As most schematics contain standard high-level components (like invertors, triggers, amplifiers, etc.), which in turn form more complicated but still standard and widely used modules, analysts must first deal with elementary components of the schematic to combine them into certain recognizable standard high-level components and modules. For example, during a typical RE process, basic circuit elements are extracted from topographical images, for example, and connections are made therebetween to re-generate the circuit's various components and modules. In order to complete this process, topographical imaging information from any and all layers of the IC is generally used. It will be apparent to one skilled in the art that the above discussion is a basic overview of the reverse engineering process and does not present all of the steps associated with or detail of the process of reverse engineering.

As stated above, the process of generating a schematic diagram from the extracted circuit elements has typically been a manual one where an analyst identifies the basic circuit elements and forms the connections therebetween to form the schematic diagram. Despite some efforts in developing automated systems for the generation of schematic diagrams, good quality schematics are still generated by such manual processes. In fact, it is sometimes considered that manually generated schematics are the standard to which schematics from other techniques of reverse engineering are to be compared.

Modern ICs however present many challenges for traditional reverse engineering techniques. These include, for example, but are not limited to, the ever-decreasing line dimensions of circuit features and the continually shrinking physical dimensions of circuit elements; the use of so-called auto-route techniques where circuit elements are located with regard to spatial considerations and not necessarily through logical placement with respect to their circuit operation; and other such considerations that will be apparent to the person skilled in the art. In their place, partially automated systems for image capture and the identification of circuit elements have been developed where these systems generally implement digital means for the storage and manipulation of information.

For instance, considerable resources have been invested into systems and methods for the extraction of circuit information from images of an IC. These systems and methods are adapted for the identification or extraction of circuit elements, the tracing of connectivity between extracted elements and the rendering of a schematic diagram of the IC. It is a goal of these systems to automate as many processes as possible, particularly in the area of design analysis. In each known system or method, however, there remain a number of manual steps that require operator intervention. Further, there are certain regions of circuitry that can make the analysis of a portion of the schematic difficult using such known systems and methods.

As stated above, reverse engineering of an integrated circuit can be roughly considered in terms of two basic processes; the extraction of circuit elements, including interconnects, and the generation of schematics therefrom. It is the later process that is of particular interest here. Some techniques have been developed for the automatic generation of schematic diagrams, or generally speaking, graph layout, wherein an energy function (e.g. a net congestion) is minimized. The resulting schematic, however, is typically of lower value for human comprehension than conventional high quality diagrams drawn by a human.

Therefore, there is a need for a new schematic generation system and method that overcomes some of the drawbacks of known techniques.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the invention is to provide a method of deriving a schematic diagram, in particular, in the reverse engineering an integrated circuit. In accordance with an aspect of the invention, there is provided a method of deriving a schematic diagram representative of an integrated circuit (IC) comprising a plurality of circuit elements, the method comprising the steps of: receiving as input a working schematic diagram identifying at least some of the circuit elements, and at least one existing schematic diagram from one or more libraries thereof; automatically identifying at least a portion of the working schematic diagram that matches at least a portion of the at least one existing schematic diagram; and replacing the identified portion from the working schematic diagram with the matching portion from the at least one existing schematic diagram, thereby forming a revised schematic diagram.

In accordance with another aspect of the invention, there is provided a computer-readable medium comprising statements and instructions for execution by a computing device to derive a schematic diagram representative of an integrated circuit (IC) comprising a plurality of circuit elements by implementing the steps of: receiving as input a working schematic diagram identifying at least some of the circuit elements, and at least one existing schematic diagram from one or more libraries thereof; identifying at least a portion of the working schematic diagram that matches at least a portion of the at least one existing schematic diagram; and replacing the identified portion from the working schematic diagram with the matching portion from the at least one existing schematic diagram, thereby forming a revised schematic diagram.

Other aspects and advantages of the invention, as well as the structure and operation of various embodiments of the invention, will become apparent to those ordinarily skilled in the art upon review of the following non-limiting description of the invention in conjunction with the accompanying drawings.

DETAILED DESCRIPTION OF THE INVENTION

Unless defined otherwise, all technical and scientific terms used herein have the same meaning as commonly understood by one of ordinary skill in the art to which this invention belongs.

For purposes of explanation, specific embodiments are set forth to provide a thorough understanding of the present invention. However, it will be understood by the person of ordinary skill in the art from reading this disclosure, that the invention may be practiced without these specific details. Moreover, well-known elements, devices, process steps and the like are not set forth in detail in order to avoid obscuring the scope of the invention described.

As introduced above, the invention, as described herein with reference to exemplary embodiments thereof, provides a new method of deriving a schematic diagram, particularly as it relates to generating such diagrams in the reverse engineering of an integrated circuit (IC). In general, the methods described herein enable the provision of a quality diagram, in some embodiments, comparable to what a person of ordinary skill in the art would appreciate consists of a good "textbook style" schematic diagram. In general, the method will have as input, circuit information, including a plurality of circuit elements, provided for example, from a read back process performed on an IC.

Figure 1A:
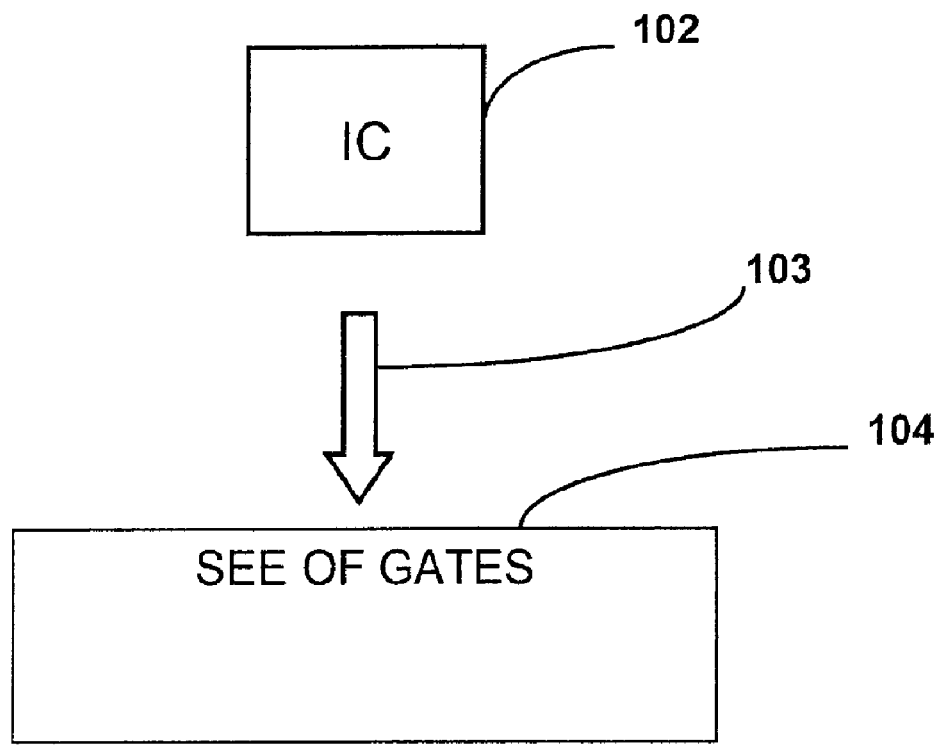
FIG. 1A is a block diagram of a system for identifying circuit elements of an IC, in accordance with one embodiment of the invention.
Figure 1B:
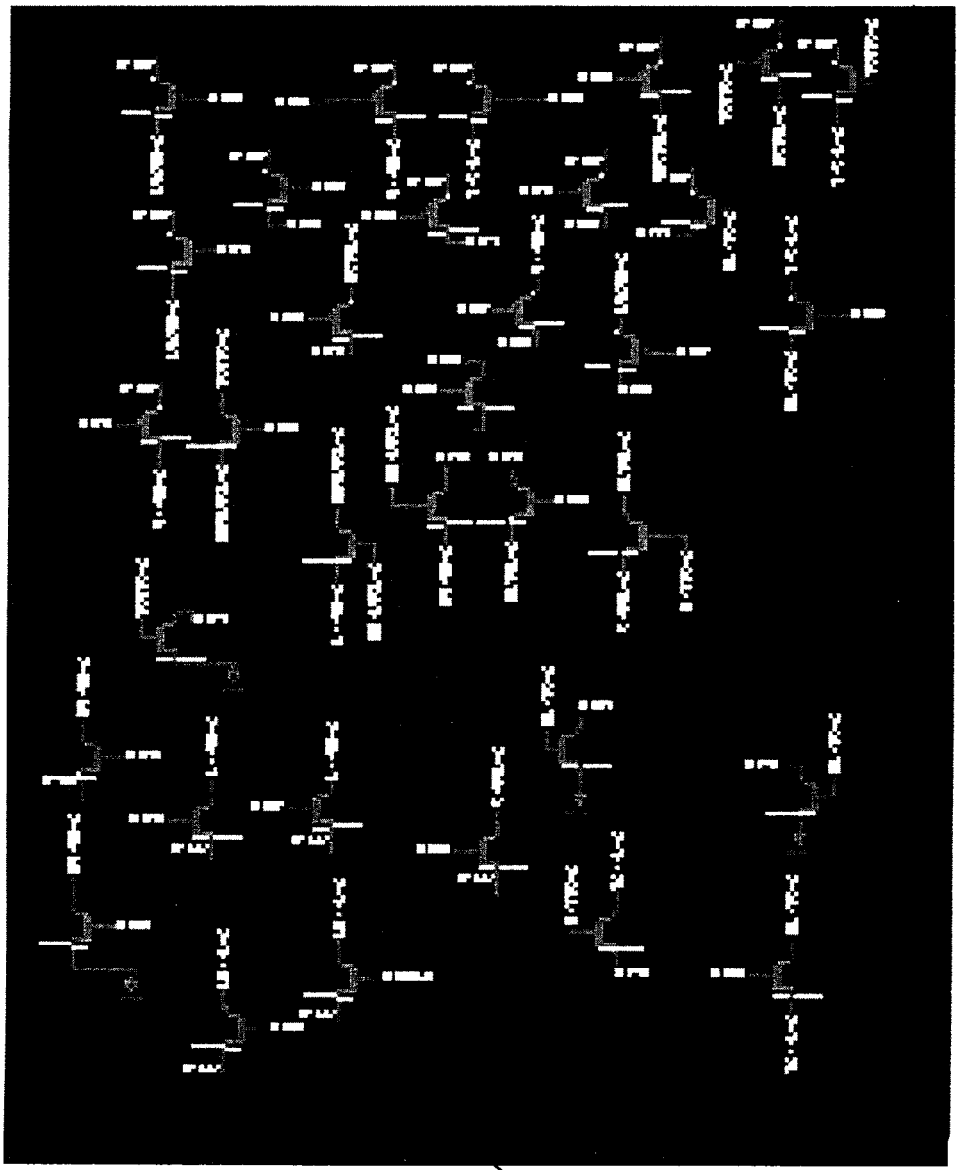
FIG. 1B is a schematic diagram of a see of gates, in accordance with one embodiment of the invention.

With reference to FIGS. 1A and 1B, and in accordance with one embodiment of the invention, a first step in a reverse engineering process is schematically illustrated. In this example of the reverse engineering of IC 102, a read back process 103, or other such process readily known in the art, is performed to extract the circuits and circuit elements present in the IC 102. In some embodiments, the read back process 103 may comprise an automated process, for example, as described in applicant's U.S. Pat. Nos. 6,907,583, 6,738,957 and 6,289,116, and co-pending United States Patent application No. 2006/0045325, all of which are herein incorporated by reference. The details of the read back process, such as those associated with the process 103, will be apparent to the person of ordinary skill in the art, and will thus not be described further herein. The circuit elements extracted during the read back process 103 are generally provided as a so-called sea of gates 104, an exemplary depiction of which is provided in FIG. 1B. Generally the sea of gates 104 will contain basic circuit elements that might include, for example, single transistors, resistors, interconnects and single and/or isolated logic gates, to name a few. The circuit elements of the sea of gates 104 will generally be labelled with respect to the connections and/or signals thereto, the physical dimensions of the element and the pin co-ordinates, for example. It is noted that the electrical connections of the gates may generally be known, and implied through the same signal labelling at the pins, even though the connections between gates are not drawn in the exemplary sea of gates 104 of FIG. 1B.

Figure 2:
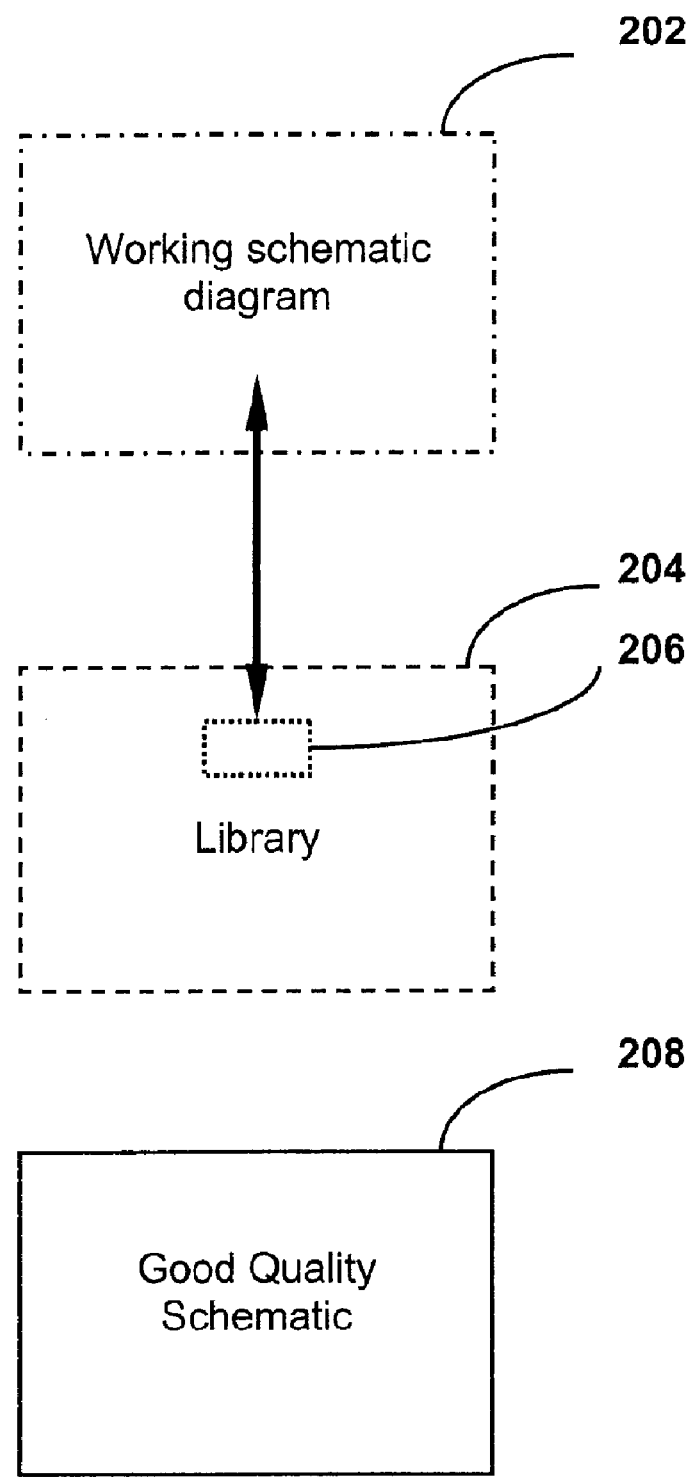
FIG. 2 is a block diagram of a method of deriving a schematic diagram, in accordance with one embodiment of the invention.

In FIG. 2, and in accordance with one embodiment of the invention, a high level block diagram of a method of deriving a schematic diagram is presented. In this example, the working schematic diagram 202 is, at first, a sea of gates, such as the sea of gates 104 of FIG. 1B. While the working schematic diagram 202 is referred to as a schematic diagram for discussion purposes, it will be apparent to the skilled artisan that it does not present the circuit elements and their connectivity in a form that is traditionally found in a schematic diagram.

A library 204 contains at least one collection of existing schematic diagrams, where each collection will include at least one good quality existing schematic diagram 206 therein, that is, at least one schematic diagram 206 whose quality is sufficient to satisfy the quality standards required for the application at hand. For example, the library 204 will generally contain existing schematic diagrams from previous projects or libraries, including but not limited to, libraries of standard cells. The skilled artisan will appreciate that the library 204 may contain schematic diagrams from different sources of good quality schematic diagrams. For example, the IC, such as IC 102 of FIG. 1A, may be a DRAM from a particular manufacturer. Schematics of a similar part from the same manufacturer might be in existence and contained within a library. This library could then be selected by the analyst to be included in the library 204. Further existing schematic libraries may be selected for inclusion in library 204 such that the library 204 contain schematics considered likely to be relevant to the a schematic diagram associated with the IC to be reverse engineered. Accordingly, use of these existing schematics can reduce the effort required to derive the schematic diagram of circuits of the IC in question.

Still referring to FIG. 2, using the working schematic diagram 202 and schematics from the library 204 as inputs to the various exemplary methods described herein may provide for the derivation of improved and/or good quality schematic diagrams 208. In some embodiments, the good quality schematic generated may be considered to be complete in terms of items including, but not limited to, connections, signals and layout information, and whose quality approaches the quality of a manually drawn schematic diagram, for example.

In the method of the current embodiment, the library 204 is searched for the existing schematic diagram 206 that presents the same components and connections of at least a portion of the working schematic diagram 202. If a match is found, the existing schematic diagram 206, or a portion thereof, is used to replace the matched portion of the working schematic diagram such that a revised, and possibly improved, working schematic diagram is produced.

In one embodiment, the searching and replacing steps of the method may comprise an iterative process that is continued until as large as possible a match is established between the existing schematic diagrams of the library 204 and the working schematic diagram 202. With this method, the working schematic diagram 202 is drawn in a manner similar to that of the schematic diagrams of the library 204. At some point, it is determined, either automatically via one or more quality threshold measures or via operator previewing and approval, that the working schematic diagram 202 is a good quality schematic and it becomes the good quality schematic 208.

Figure 3:
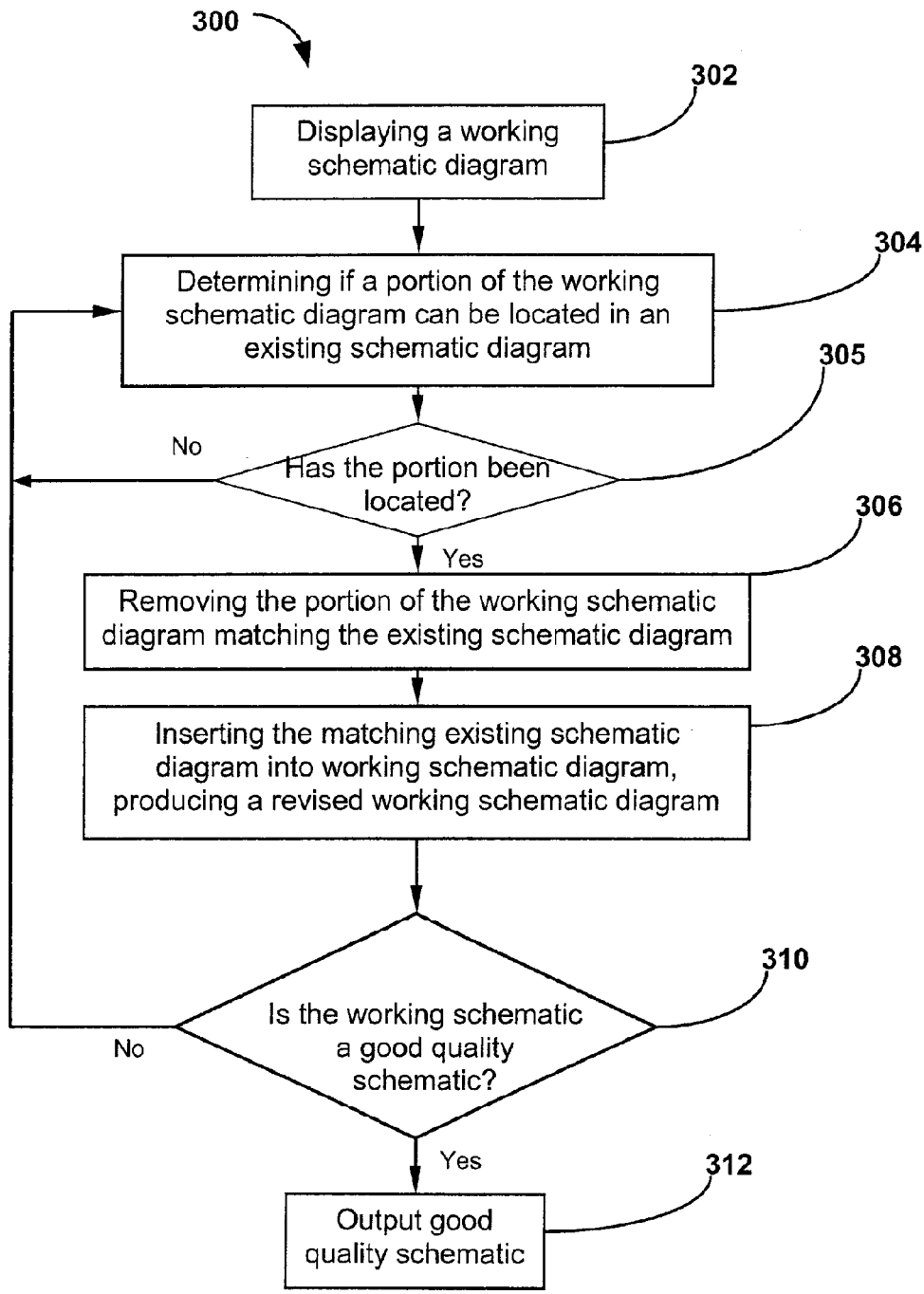
FIG. 3 is a flow chart of a method of deriving a schematic diagram, in accordance with one embodiment of the invention.

FIG. 3 presents a flow chart of method 300 of deriving a good quality schematic diagram according to an embodiment of the invention. At step 302, a working schematic diagram is displayed, where the working schematic diagram contains a plurality of circuit elements and will generally result from a read back process, such a the process 103 of FIG. 1A. At step 304, at least one existing schematic diagram from a library is compared to a portion of the working schematic diagram. If a match is not found at step 304 the method returns to step 304, via step 305, to compare another existing schematic diagram.

If step 305 determines that there is a match between the portion and one of the existing schematic diagrams, the portion is removed from the working schematic diagram at step 306. The matching existing schematic diagram portion is then inserted into the working schematic diagram at step 308, producing a revised working schematic diagram. At step 310 it is queried as to whether the revised working schematic diagram is a good, or at least improved, schematic diagram. If the revised working schematic diagram is not of sufficient quality, the method returns to step 304 and the library of schematics is further considered to find a matching existing good schematic diagram. Finally, if the revised schematic diagram is considered to be of sufficient quality at step 310, it is output at step 312.

A central feature of the method 300 is the matching of a portion of the working schematic diagram with a schematic diagram from the library of schematic diagrams at step 304. Further embodiments of the invention will consider the methods implemented in step 304 in more detail.

A basic premise of various embodiments is that portions of a working schematic diagram can be compared with and replaced by at least one existing schematic diagram in an automated manner, allowing for development of a good quality schematic diagram.

Figure 4A:
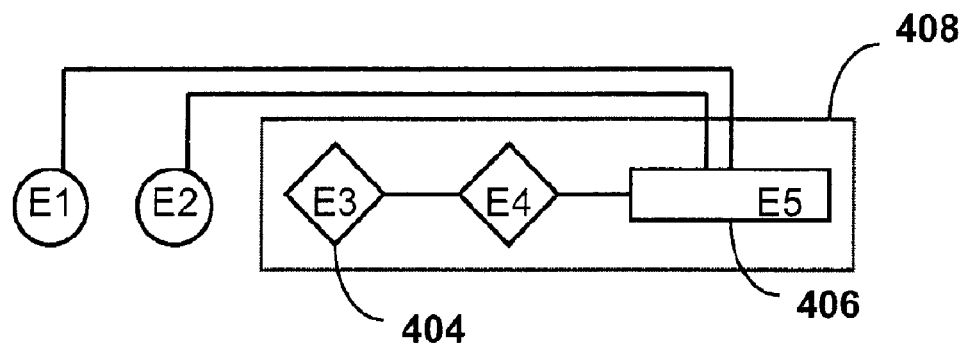
FIG. 4A is a diagram of portion of a working schematic diagram, in accordance with one embodiment of the invention.
Figure 4B:
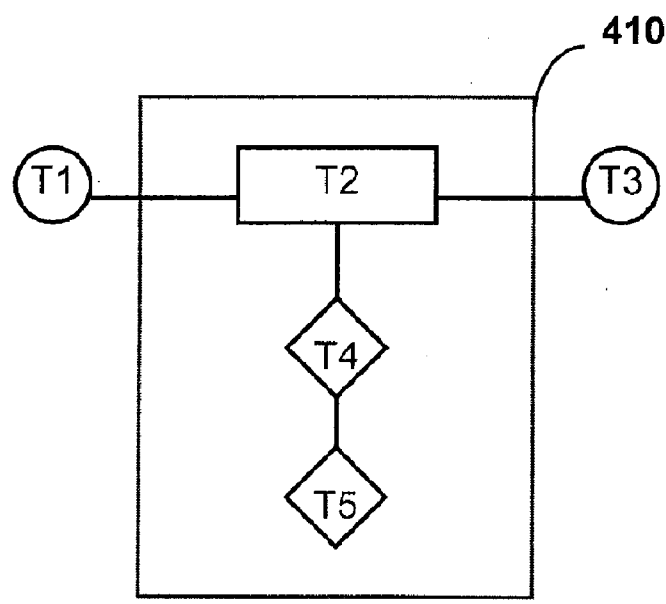
FIG. 4B is a diagram of an existing schematic diagram as may be found in a library of schematic diagrams, in accordance with one embodiment of the invention.
Figure 5A:
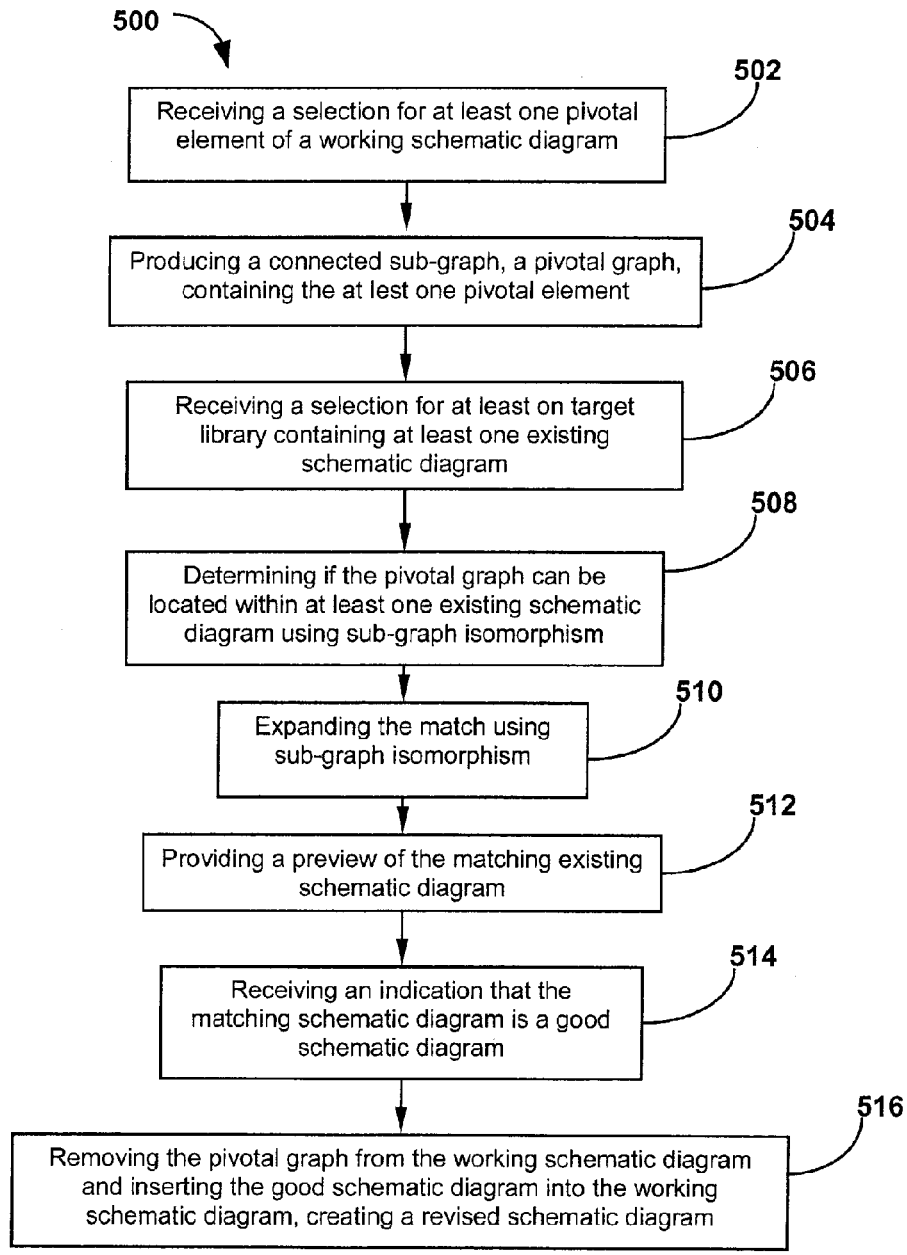
FIG. 5A is a flow chart of a method for deriving a schematic diagram, in accordance with one embodiment of the invention.

The matching and replacing of gates from a working schematic, according to an embodiment of the invention, is considered with regard to the exemplary schematic diagrams of FIGS. 4A and 4B and the method 500 of FIG. 5A. FIG. 4A presents a working schematic diagram that is poorly organized and is not in a traditional format, as will be apparent to the skilled artisan. FIG. 4B presents a schematic diagram that is located within a selected library. While they appear quite different, the respective schematic diagrams of FIGS. 4A and 4A are in fact the same.

In the current embodiment, the method of comparing, as presented in method 500, implements a starting point. Namely, so-called pivotal elements are identified, where an analyst considers the pivotal elements are likely part of a higher-level structure within the working schematic diagram and might be found in an existing schematic diagram. Therefore method 500 begins with receiving a selection of pivotal elements at step 502. With regard to FIG. 4A, the elements E3 404 and E5 406 have been identified as pivotal elements. The selected pivotal elements are, in this case, unconnected which can lead to difficulties in subsequent calculations. In the current embodiment, a connected sub-graph is used. Thus a connected pivotal graph 408 containing the pivotal elements E3 404 and E5 406 is automatically produced at step 504. The pivotal graph 408 contains connected elements E3, E4, E5, where element E3 404 provides for connection of the selected pivotal elements. The algorithm for deriving such a connected sub-graph is, in the current embodiment, based on a breadth first search (BFS) algorithm. The use of a BFS algorithm and the details thereof will be apparent to the skilled artisan.

At step 506, a selection of at least one target library of existing schematic diagrams is received. In the current embodiment, an analyst selects the target libraries. The selected target library will generally contain at least one existing schematic diagram, such as that presented in FIG. 4B. In an alternative embodiment, the target library may be pre-programmed. The automated selection of target libraries would consider various aspects of the IC being analyzed, including, but not limited to, the manufacturer, functionality and functional blocks thereof, for example.

At step 508, a determination is made as to whether the pivotal graph produced at step 504 can be located within at least one existing schematic diagram of the target libraries. If a pivotal graph is located at step 508, the "area" of the match is located at step 510. As will be explained in more detail in subsequent embodiments, the match is expanded by determining if additional circuit elements of the working schematic diagram can be appended to the pivotal graph, and if the enlarged portion of the working schematic diagram can be located in at least one of the existing schematic diagrams. At step 512, a preview of the matching existing schematic diagram is provided. An indication of whether the matching existing schematic diagram is a good schematic diagram is received at step 514. At step 516, the pivotal graph and any circuit elements of the expanded match, are removed from the working schematic diagram and the matching existing schematic diagram is inserted in the working schematic diagram to form a revised working schematic diagram.

Figure 5B:
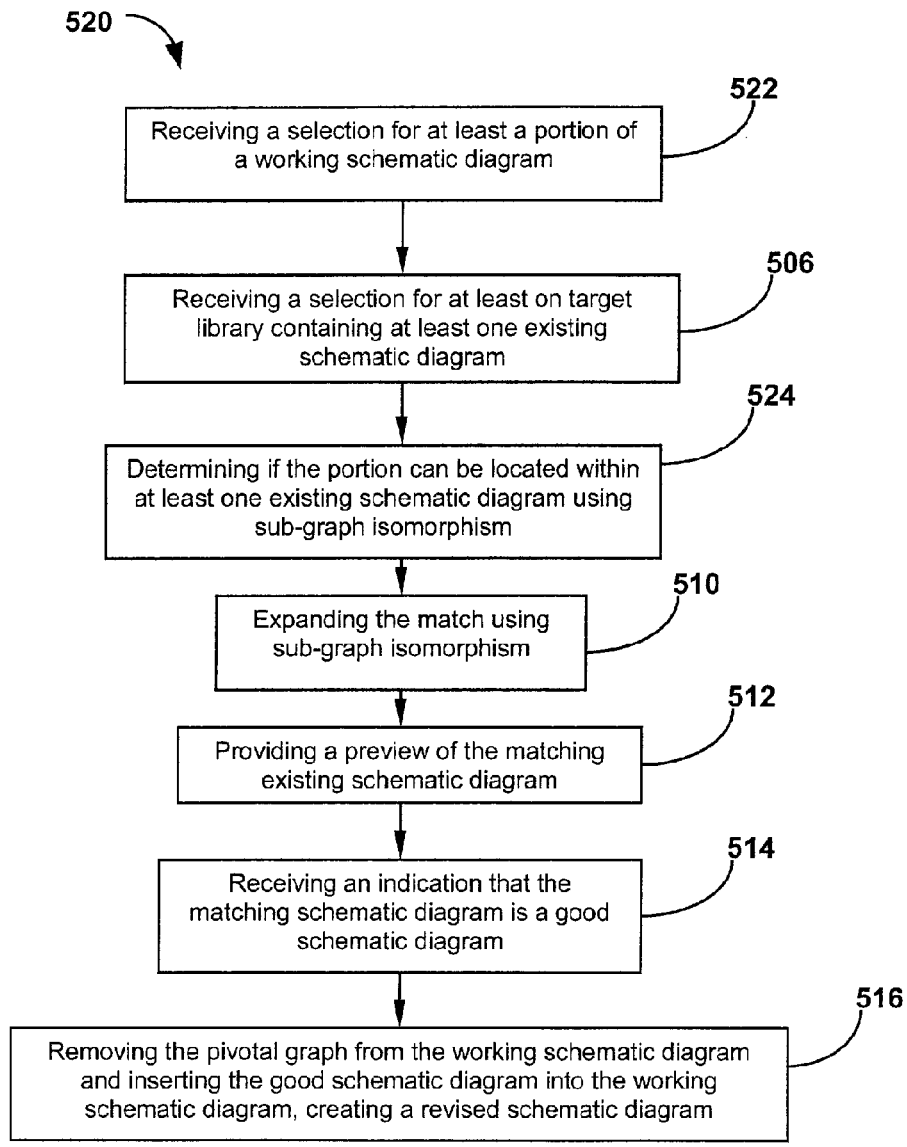
FIG. 5B is a flow chart of a method for deriving a schematic diagram, in accordance with one embodiment of the invention.

In another embodiment of the invention, presented as method 520 in FIG. 5B, a pivotal graph is not implemented. Thus, at step 522, a selection for at least a portion of the working schematic diagram is received. At step 524, it is determined whether the portion is located in the existing schematic diagram. This step of locating implements steps associated with sub-graph isomorphism.

At either step 304 of FIG. 3, step 508 of FIG. 5A or step 524 of FIG. 5B, at least a portion of the working schematic diagram is compared to at least one existing schematic diagram, or portion thereof, to determine if the at least one portion can be located within the existing schematic diagram. Additionally, at step 510, any match that is located is expanded to incorporate a larger portion of the schematic diagram. In one embodiment, both of these processes implement techniques associated with sub-graph isomorphism.

The first step in using sub-graph isomorphism is the conversion of the schematics to graphs that can be compared.

Figure 6:
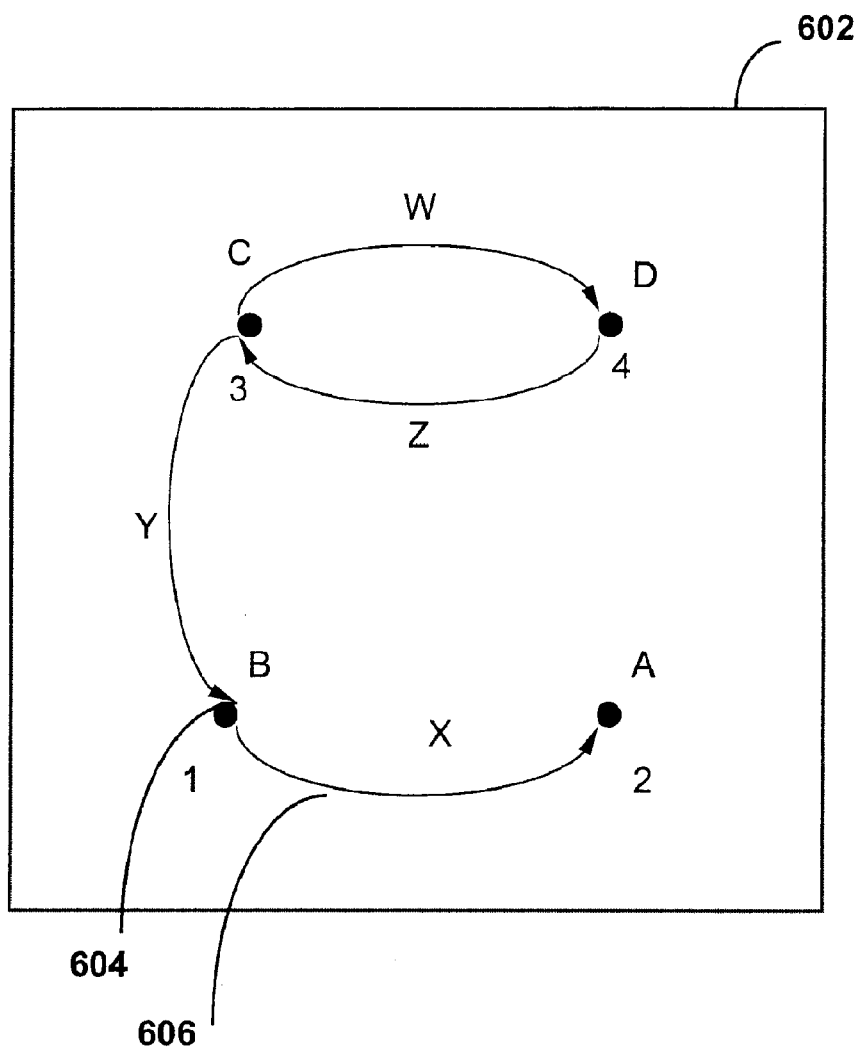
FIG. 6 is an exemplary graph, in accordance with one embodiment of the invention.

An exemplary graph according to an embodiment of the invention is presented in FIG. 6. The graph 602 comprises vertices such as vertex 604 and edges such as edge 606. A labelled directed graph (G), such as graph 602, may be given by the equation:

$$G=(V,E,Lv,Le)$$

where V is a finite set of vertices; E is a set of the edges and subset of $V^2$; Lv are labels associated with the vertices, such that Lv: V-> strings; and Le is the set of labels assigned to edges, such that Le: E-> strings.

The graph 602 has four (1, 2, 3, 4) vertices such that:

$$V=\{1,2,3,4\};$$

$$E=\{(4,3),(3,4),(3,1),(1,2)\};$$

$$Lv(1)=B, Lv(2)=A, Lv(3)=C, Lv(4)=D; \text{ and}$$

$$Le(3,4)=W, Le(4,3)=Z, Le(3,1)=Y, Le(1,2)=X.$$

In general, two graphs, such as, G1=(V1, E1, Lv1, Le1) and G2=(V2, E2, Lv2, Le2) can be considered isomorphic if a function f(I): G1->G2 is a bijection function, i.e. has one to one correspondence, such that I(v), I(u) in E2 if and only if (u,v) is in E1, i.e.

$$Lv1(v)=Lv2(I(v)), Le1(u,v)=Le2((I(u),I(v)).$$

In general a schematic diagram might be considered as a graph G. In the various embodiments of the invention, a portion of the schematic is considered, which may in fact consist of individual gates. Such a portion may be considered a sub-graph of the graph G. Therefore, if G can be described by (V, E, Lv, Le), then S, which is a subset of V, defines a sub-graph thereof. Accordingly, the graph (S, ES, Lv, Le) can be called a sub-graph of G induced by S, where ES is a subset of edges that have both vertices within S.

Figure 7A:
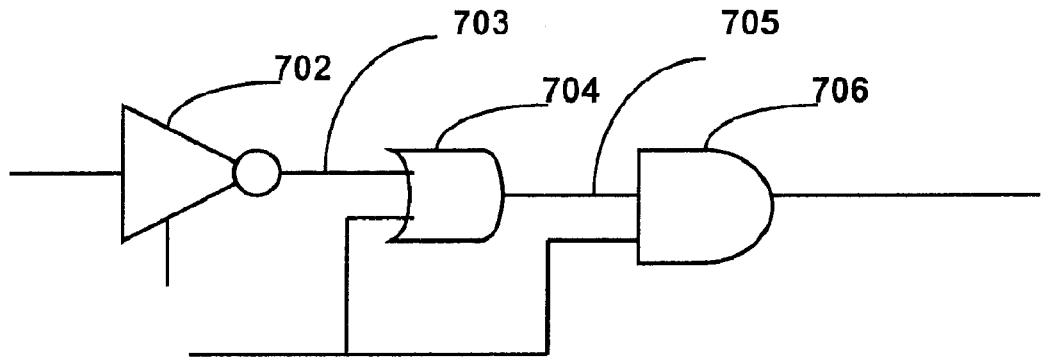
FIG. 7A is an exemplary schematic diagram, in accordance with one embodiment of the invention.
Figure 7B:
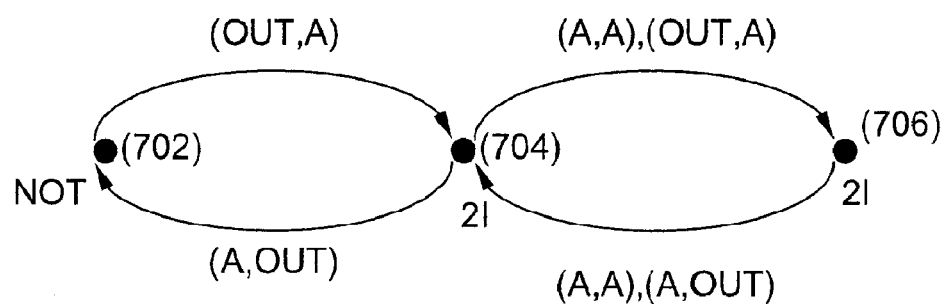
FIG. 7B is a graph representation of the schematic diagram of FIG. 7A, in accordance with one embodiment of the invention.

An example of the generation of a sub-graph from a schematic diagram is presented in FIGS. 7A and 7B. The schematic diagram of FIG. 7A contains an inverter 702, a NOR gate 704 and a NAND gate 706. The corresponding sub-graph is presented in FIG. 7B. A graph for a particular schematic diagram is developed assuming there is one vertex for each gate and if there is a connection between two gates, there are edges, going in both directions, between the connected gates. Therefore the graph of FIG. 7B contains a vertex for each gate of FIG. 7A and two (2) edges, one in each direction, for every connection between gates. Thus the connection 703 produces the edges (OUT,A) and (A, OUT), and the connection 705 produces the edges (A,A), (OUT,A) and (A,A), (A, OUT).

The vertex labels Lv are the identifier of a group of equivalency of gates that can be substituted for each other for drawing purposes (e.g. the gates have similar functionality, size, and pin location, and can thus be depicted equivalently or similarly on a schematic diagram). For example, a NOT gate can be deemed to be equivalent with a buffer and a diode, thereby providing the group id NOT; a NOR gate can be deemed equivalent with a NAND gate, thereby resulting in group id 2I. For example, although the functionally may be different, NOR gate 704 and NAND gate 706 can be considered replaceable for schematics drawing purposes—i.e. each schematics that looks good with NAND gate 706 will look good with NOR gate 704.

Before building the rule for Le, it is noted that in general many gates have swappable pins. This generally relates to the fact that for some components, the exact pin to which the connection is made is immaterial. For example, the NOR gate 704 has pins A, B and OUT, with pins A and B being swappable. One may want to allow such swaps in generated schematics. Accordingly, all pins in the swappable group (A, B) may be treated as having name A.

Thus, Le(v,u) may be defined as the list of the pairs (pinU, pinV), where pinU is the name of the pin associated with gate u, and pinV is the name of the pin associated with gate V. In one embodiment, the list is sorted in lexicographical order.

With the labelled sub-graphs associated with the pivotal graph, and the labelled graphs associated with the existing schematic diagrams now calculated, algorithms for the comparison of graphs according to an embodiment of the invention will now be considered.

At step 508 of FIG. 5, all instances of the pivotal graph 408 within the library of graphs (i.e. existing schematic diagrams) are located using subgraph isomorphisms. More formally, the problem finds, for a given pivotal graph, all subsets of vertices of the graph(s) within the library where the induced subgraph is isomorphic with the pivotal graph. This is generally referred to as a NP complete program. Such programs are generally known by the skilled artisan and a substantial body of work surrounds the algorithms that address such programs from a practical view point. A good overview of such programs is provided in the paper by P. Foggia, C. Sansonne and M. Vento, "A performance comparison of five algorithms for graph isomorphism", Workshop on Graph-based Representations in Pattern Recognition, May 23-25, 2001, the entire contents of which are incorporated herein by reference.

Figure 8:
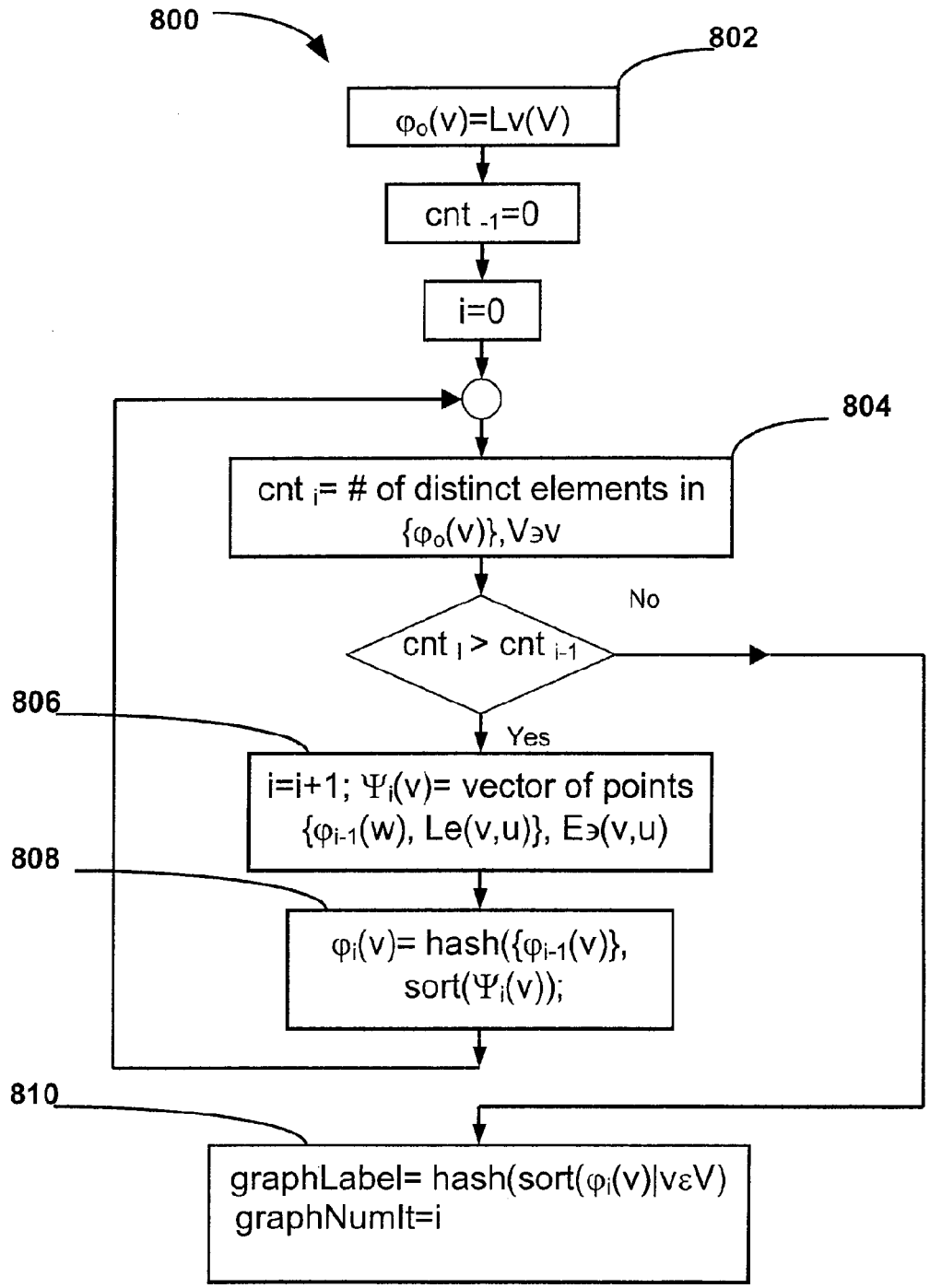
FIG. 8 is a flow chart of a method for comparing at least a portion of a working schematic diagram with an existing schematic diagram, in accordance with one embodiment of the invention.

FIG. 8 presents a method 800, in accordance with one embodiment of the invention, for determining an invariant hash label for a given graph. It has been found that method 800 provides good practical performance for the graphs that result form schematic diagrams as would be found in a reverse engineering environment.

At step 806, a label $\Psi_i$, representing the direct neighbourhood of a given vertex is calculated for each vertex. At step 808, the label $\Psi_i$ just calculated for a given vertex is integrated into the current label $\phi_i$ for this vertex. This calculation continues such that the vertices of the graph are becoming more distinguishable. At step 808, a hash function for each $\phi_i(v)$ is calculated.

A graphLabel is calculated for a given graph. For practical purposes, it is considered that graphs whose graphLabel computed at step 810 are equivalent are isomorphic. Theoretically this assumption may result in some false positives, but no false negatives. It has been found that this assumption has not led to any significant practical problems.

It is noted that, in this embodiment, the function sort used at steps 808 and 810 is a lexicographical sort of it's argument vector, which will be apparent to the skilled artisan.

In one embodiment, the method 800 implements a 64 bit hash function instead of using strings for graphLabels. The use of such a hash function has been found to improve the performance of the method. In such embodiments, a perfect hash function (e.g. as described in Thomas H. Cormen, Charles E. Leiserson, Ronald L. Rivest, and Clifford Stein, Introduction to Algorithms, Second Edition, MIT Press and McGraw-Hill, 2001, Section 11.5: Perfect hashing, pp. 245-249), an ordinary hash function, a CRC function (e.g. CRC32), or the like, can be implemented at steps 808 and 810. It will be apparent to the person of ordinary skill in the art that other types of hash functions may also be implemented without departing from the general scope and nature of the present disclosure.

Figure 9A:
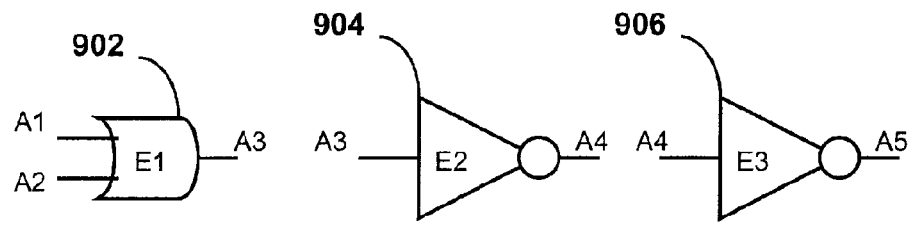
FIG. 9A is a diagrammatical representation of circuit elements of a working schematic diagram, in accordance with one embodiment of the invention.
Figure 9B:
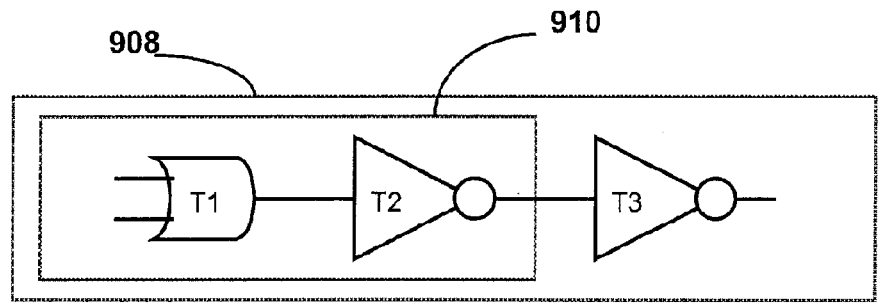
FIG. 9B is a diagrammatical representation of an existing schematic diagram as may be found in a library of schematic diagrams, in accordance with one embodiment of the invention.
Figure 9C:
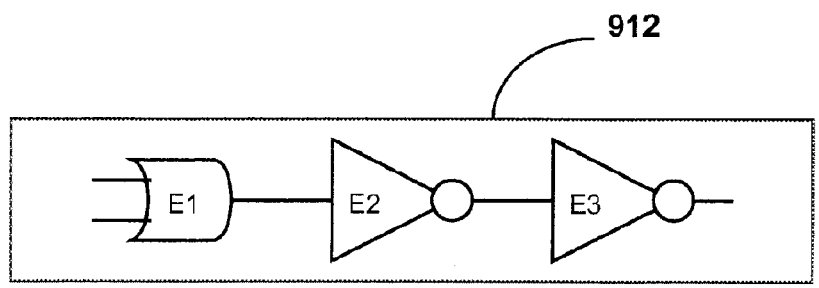
FIG. 9C is a revised or expanded schematic diagram, in accordance with one embodiment of the invention.

The use of method 800 in the locating of matching sub-graphs and the expansion of the subsequent matches will now be considered with reference to FIGS. 9A to 9C, and in accordance with one embodiment of the invention.

FIG. 9A presents two gates that are part of a working schematic diagram. In general, the gates 902, 904 and 906 all have known identities and connections. In this example, gate 902 is labelled as E1 and has signals A1, A2 and A3 associated therewith; gate 904 is labelled as E2 and has signals A3 and A4 associated therewith, and gate 906 is labelled as E3 and has signals A4 and A5 associated therewith. The connectivity information, i.e. signals, may be presented in a variety of formats. In the current embodiment, E1, E2 and E3 have string labels associated with their desired connections. This approach is outlined in applicant's United States Patent Application, published as 20070256037, the entire contents of which are incorporated herein by reference. In this approach if two connections have the same label, they are connected and this connection may be drawn on a final schematic diagram. With reference to FIG. 9A, the gates E1 902 and E2 904 both have a signal A3 associated therewith, therefore these elements are connected.

For purposes of illustration, the gates E1 902 and E2 904 have been selected as elements of a pivotal graph. FIG. 9B presents an existing schematic diagram 908 that is located within a library of existing schematics, and which comprises a diagram portion 910 comprising elements T1 and T2 similar to gates E1 902 and E2 904 of the pivotal graph. The gates 902 and 904 that form the pivotal graph, as well as the portion 910 of existing schematics 908 of the library, are therefore converted to sub-graphs and graphs, respectively, according to the techniques discussed above. It will generally be the case that there will be more than one existing schematic diagram in the library.

In this embodiment, the match may be expanded by determining if additional circuit elements of the working schematic diagram (e.g. element E3 906 of FIG. 9A) can be appended to the pivotal graph, and if the enlarged portion of the working schematic diagram can be located in at least one of the existing schematic diagrams. In this example, it is determined that element E3 906 can be appended to the pivotal graph to form an enlarged portion, as a similar enlarged portion (e.g. schematic 910) is available in the library. This process thus leads to a revised or expanded schematic diagram 912, as see in FIG. 9C.

Figure 10:
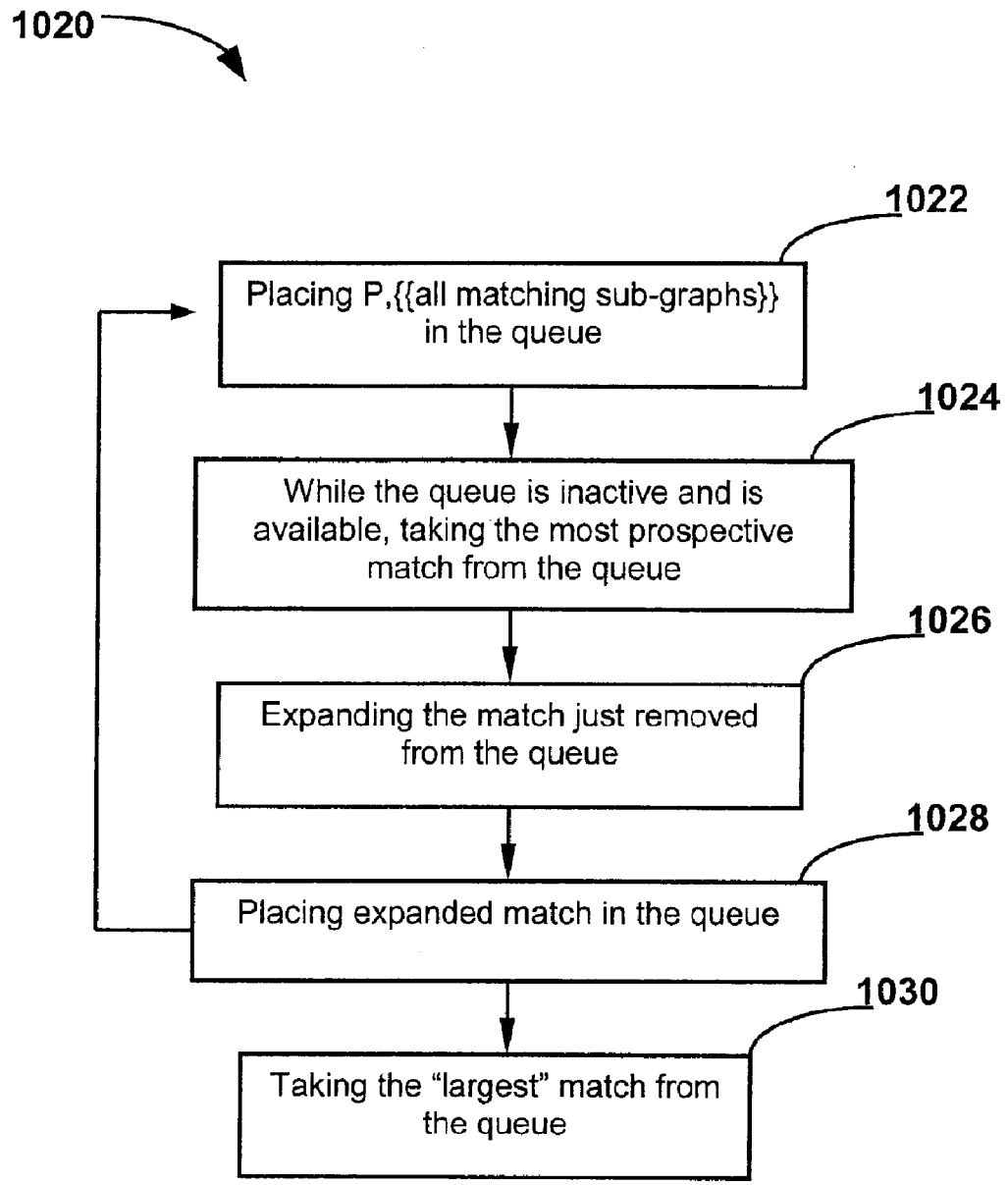
FIG. 10 is a flow chart of a process for expanding a matched portion of a schematic diagram, in accordance with one embodiment of the invention.

Referring now to FIG. 10, and in accordance with one embodiment of the invention, a flow chart depicting a process 1020 for expanding matching sub-graphs is depicted. In this embodiment, all matching sub-graphs are put in a queue in step 1022 for use in generating a schematic diagram (e.g. as produced at step 504 of FIG. 5A). While the queue is inactive and available, the most prospective match in the queue is selected at step 1024 and expanded at step 1026, as described above.

The recently expanded match is then returned to the cue at step 1028. Through this process, larger matches may thus be made available for selection from the queue as needed at step 1030.

Figure 11:
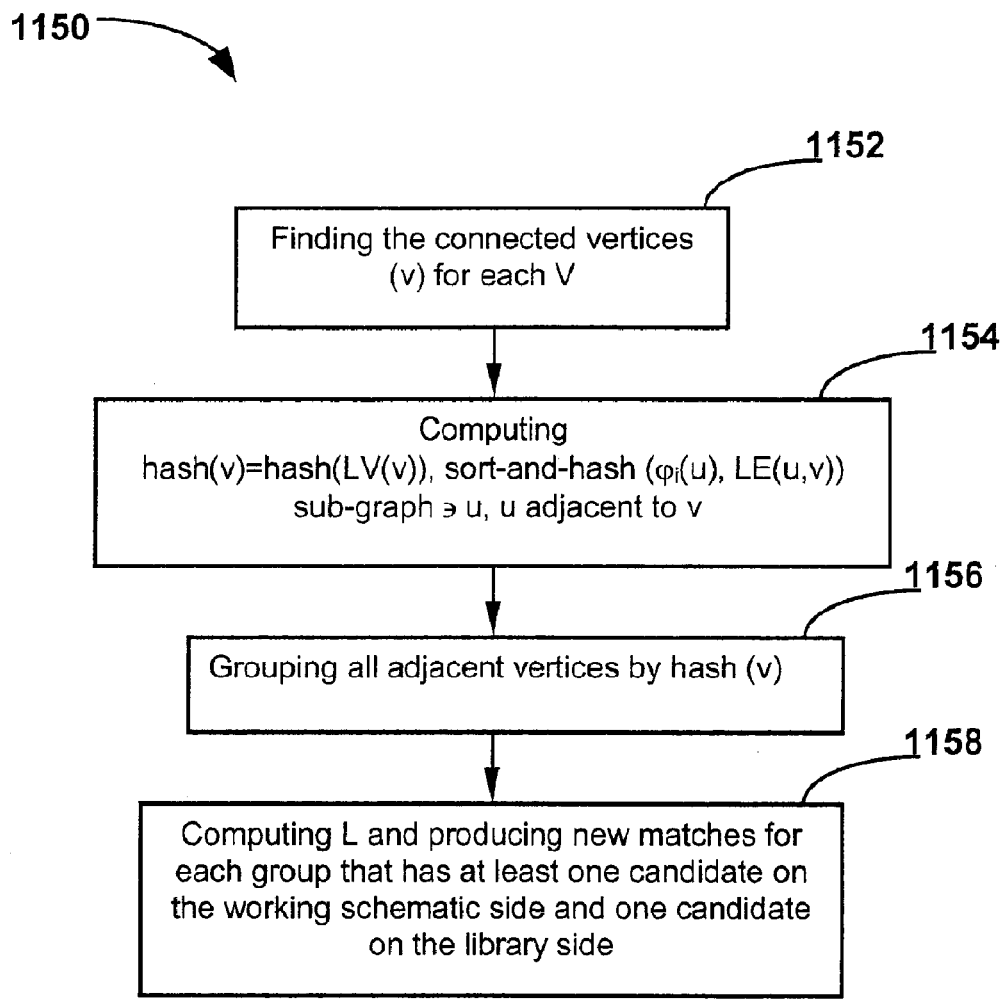
FIG. 11 is a flow chart of a process for comparing schematic diagrams, in accordance with one embodiment of the invention.

With reference to FIG. 11, and in accordance with one embodiment of the invention, a process 1150 is presented for implementing a match expanding step, such as step 1026 of FIG. 10. In this process, the selected match is expanded by first identifying the connected vertices thereof in step 1152, and implementing a series of computations as identified by steps 1154, 1156 and 1158, and described above, for producing new matches to be added to the queue for use in generating the schematic diagram.

While the invention has been described according to what is presently considered to be the most practical and preferred embodiments, it must be understood that the invention is not limited to the disclosed embodiments. Those ordinarily skilled in the art will understand that various modifications and equivalent structures and functions may be made without departing from the spirit and scope of the invention as defined in the claims. Therefore, the invention as defined in the claims must be accorded the broadest possible interpretation so as to encompass all such modifications and equivalent structures and functions.

What is claimed is:

1. A method of deriving a schematic diagram representative of an integrated circuit (IC) comprising a plurality of circuit elements, the method comprising steps of:
   receiving as input a working schematic diagram identifying at least some of the circuit elements, and at least one existing schematic diagram from one or more libraries thereof;
   automatically identifying, using a computer, at least a portion of the working schematic diagram that matches at least a portion of the at least one existing schematic diagram; and
   replacing the identified portion from the working schematic diagram with the matching portion from the at least one existing schematic diagram, thereby forming a revised schematic diagram.

2. The method according to claim 1, further comprising steps of:
   receiving an indication that the revised schematic diagram is an improved schematic diagram, else repeating the identifying and replacing steps; and
   providing the revised schematic diagram as an improved schematic diagram.

3. The method according to claim 1, further comprising a step of removing a polarity of at least one circuit element of the plurality of circuit elements.

4. The method according to claim 1, wherein the step of identifying is independent of symmetry within the at least one existing schematic diagram.

5. The method according to claim 1, further comprising steps of:
   performing a read back operation on the IC;
   determining a presence of the plurality of circuit elements within a circuit of the IC; and
   compiling the working schematic diagram comprising the plurality of circuit elements.

6. The method according to claim 1, wherein said identifying step comprises:
   selecting at least one pivotal circuit element from the working schematic diagram;
   producing a connected sub-graph having the at least one pivotal circuit element; and
   identifying a matching portion from the at least one existing schematic diagram using sub-graph isomorphism.

7. The method according to claim 6, further comprising a step before the replacing step of receiving an indication that the identified matching portion provides an improved representation of the at least one pivotal circuit element, else repeating the identifying step.

8. The method according to claim 7, wherein the working schematic diagram comprises a sea of gates.

9. The method according to claim 1, wherein the method comprises a computer-implemented method.

10. A non-transitory computer-readable medium comprising statements and instructions for execution by a computing device to derive a schematic diagram representative of an integrated circuit (IC) comprising a plurality of circuit elements by implementing steps of:

receiving as input a working schematic diagram identifying at least some of the circuit elements, and at least one existing schematic diagram from one or more libraries thereof;

identifying at least a portion of the working schematic diagram that matches at least a portion of the at least one existing schematic diagram; and replacing the identified portion from the working schematic diagram with the matching portion from the at least one existing schematic diagram, thereby forming a revised schematic diagram.

11. The non-transitory computer-readable medium according to claim 10, the statements and instructions further for implementing steps of:

receiving an indication that the revised schematic diagram is an improved schematic diagram, else repeating the identifying and replacing steps; and providing the revised schematic diagram as an improved schematic diagram.

12. The non-transitory computer-readable medium according to claim 10, further comprising steps of:

performing a read back operation on the IC;

determining a presence of the plurality of circuit elements within a circuit of the IC; and compiling the working schematic diagram comprising the plurality of circuit elements.

13. The non-transitory computer-readable method according to claim 10, wherein said identifying step comprises:

selecting at least one pivotal circuit element from the working schematic diagram;

producing a connected sub-graph having the at least one pivotal circuit element; and identifying a matching portion from the at least one existing schematic diagram using sub-graph isomorphism.

* * * * *